April 14, 1970 J. L. LANGDON ET AL 3,506,880

SEMICONDUCTOR DEVICE

Original Filed June 28, 1963 3 Sheets-Sheet 1

INVENTORS
JACK L. LANGDON
RAYMOND P. PECORARO
BY George O. Saile
ATTORNEY

United States Patent Office 3,506,880
Patented Apr. 14, 1970

3,506,880
SEMICONDUCTOR DEVICE

Jack L. Langdon and Raymond P. Pecoraro, Wappingers Falls, N.Y., assignors to International Business Machines Corporation, New York, N.Y., a corporation of New York Original application June 28, 1963, Ser. No. 291,322. Divided and this application Jan. 29, 1969, Ser. No. 794,971
Int. Cl. H01l *19/00*
U.S. Cl. 317—101 11 Claims

ABSTRACT OF THE DISCLOSURE

A semiconductor device which includes a hermetically sealing metal layer that covers at least a portion of a metal layer which is in ohmic contact with the semiconductor device to prevent ambient impurities from attacking the portion of the contact.

CROSS-REFERENCE TO RELATED APPLICATION

This application is a division of co-pending U.S. patent application Ser. No. 291,322, filed June 28, 1963, now Patent No. 3,429,029.

BACKGROUND OF THE INVENTION

Field of the invention

This invention relates to semiconductor devices and to a process of fabricating said devices. In particular, it relates to semiconductor devices having improved ohmic contacts and to a process for forming said devices.

Description of the prior art

The formation of ohmic contacts on semiconductor devices has been a constant problem in the past. The problem has been aggravated by the advent of increasingly smaller semiconductor devices. As semiconductor devices have become smaller, it has become necessary for the ohmic contacts associated with them to decrease in size. Complex manufacturing techniques have been evolved to cope with that problem. For example, prior art attempts have included coating a semiconductor with a single protective layer, etching holes in that layer and depositing a contact metal in said holes. Even with such advanced fabrication techniques, ohmic contacts formed thereby have frequently been subject to deterioration. This deterioration has commonly been due to moisture and other atmospheric impurities wending their way down tiny crevices between the contact metal and the surface protective coating so as to contaminate the device. High resistance contacts result. Undesired variations in the response characteristics of the device then occur.

Accordingly, it is an object of this invention to provide a semiconductor device whose contact structures provide improved operating characteristics.

Another object is to provide a semiconductor device having contact structures more impervious to ambient impurities than prior art devices.

A further object is to provide a semiconductor device of the type described wherein the contact structures are extremely small, but easily fabricated.

Yet another object is to provide a semiconductor device having all the above characteristics, and further characterized by the fact that it can be electrically connected to a supporting conductive member without establishing undesired electrical conduction between certain regions of said device and said supporting member.

A still further object is to provide a process for forming a semiconductor device having the superior characteristics outlined above.

Yet another object is to provide a semiconductor device having the superior characteristics noted above and fabricated by the process of this invention.

SUMMARY OF THE INVENTION

Briefly stated and in accordance with one aspect of the invention, we provide a unique process for fabricating a device in which precisely dimensioned holes are made in a protective coating over surface regions of the device with ohmic contacts formed in the holes, and in which a layer of hermetic metal is applied to the ohmic contacts and protective coating so as to prevent dissemination of impurities to the device. Thereafter, a unique formation of wettable metal is applied to the device to facilitate joining it to a conductive substrate.

In accordance with a more detailed aspect of the invention, a planar semiconductor has dual protective coatings fabricated on its upper surface. The coating contiguous to the semiconductor slab comprises an oxide of the semiconductor material, and contiguous to the oxide layer is a layer of glass. The oxide layer protects the surface of the semiconductor during the subsequent formation of the glass layer. The glass layer provides an added protection for the surface of the semiconductor and serves as a mask when holes are subsequently etched in said oxide layer. Holes of a fine tolerance are etched through both these layers by a novel process. A contact metal is then deposited within these holes so as to establish ohmic contacts to semiconductor surface regions. A layer of hermetic metal is then deposited so as to effectively seal the contact regions. In a specific embodiment, a layer of wettable metal is then placed onto the hermetic metal and the semiconductor device is ready for attachment to conductive paths on a substrate. In still another embodiment, a nonoxidizable metal is also placed over the wettable metal so as to insure a low resistance contact structure. A further embodiment provides an additional material over the nonoxidizable metal so as to facilitate joining the device to a substrate.

The process as above described makes a semiconductor device having superior characteristics. So, in accordance with another aspect of our invention, we provide a unique semiconductor device made by the process of this invention.

It has been found that the semiconductor device itself offers certain unique advantages. That semiconductor device constitutes another aspect of our invention.

The semiconductor device which is hereinafter described has precise ohmic contacts formed to surface regions and, in particular, to surface junction regions. Despite the small space between adjacent surface junction regions on a semiconductor body, a firm contact to each is insured. Further, such contacts are not subject to deterioration from ambient impurities as time passes. Rather, a unique structure is provided which guarantees the absence of such impurities from the delicate surface of the semiconductor device. The dual protective coatings increase the thickness of dielectric material under the contact land patterns, thereby lowering the capacitance of the structure. Since an embodiment of the invention contemplates a semiconductor device having a plurality of surface junction regions and a plurality of ohmic contacts associated with the surface junction regions, as well as with nonjunction regions of the surface, it is noteworthy that the invention offers unique advantages for that embodiment by providing a further material formation on the contacts. It allows joining such a device to a substrate having discrete conductive areas with certainty that undesired shorting will not take place.

Electrical conduction will only be established between the ohmic contacts and the conductive paths on the substrate. No conduction will occur between other regions of the device and the substrate.

BRIEF DESCRIPTION OF THE DRAWINGS

The foregoing and other objects, features and advantages of the invention will be apparent from the following more particular description of preferred embodiments of the invention, as illustrated in the accompanying drawings.

DESCRIPTION OF PREFERRED EMBODIMENTS

Figure 1:
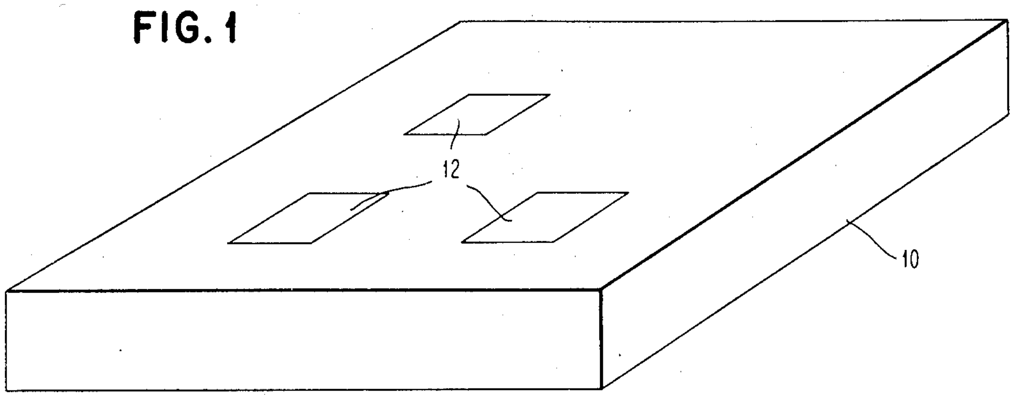
FIGURE 1 shows a planar semiconductor device having a plurality of surface junction regions.

Referring generally to FIGURE 1, a basic semiconductor device is shown. It is to have contact regions formed upon it in accordance with the teachings of this invention. The semiconductor device is fabricated from a wafer 10 of semiconductor material; such as P-type silicon, N-type silicon, or epitaxially grown combinations of N and P type material. For purposes of illustration, wafer 10 will be referred to as P-type silicon in this patent. A plurality of surface junction regions 12 may be formed on discrete areas of the surface of wafer 10 by conventional techniques. A suitable technique comprises diffusing impurities of an opposite conductivity type (for example, N-type impurities) through a mask onto discrete areas of wafer 10. Thus, PN junctions are formed at surface junction regions 12.

Referring now to FIGURES 2 through 7, certain steps of the process are shown. Each of the figures represents the basic semiconductor device of FIGURE 1 as it undergoes processing. For illustration, the formation of a contact to a single surface junction region 12 will be shown, although it should be understood that a contact may be formed at any other location on the surface of wafer 10.

Figure 2:
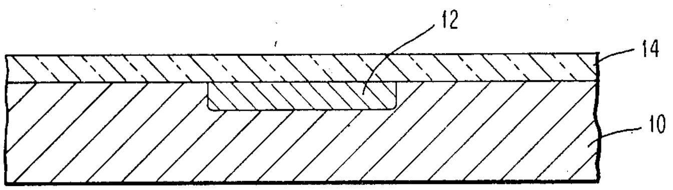
FIGURES 2–7 show a single junction of said device in various stages of producing an ohmic contact thereto.

FIGURE 2 shows the wafer 10 of P-type silicon having surface junction region 12, formed as described above. A silicon dioxide layer 14 is grown upon the entire upper surface of wafer 10. For purposes of illustration, layer 14 may be roughly 8,000 A. to 10,000 A. thick. Although other conventional methods may be employed, a preferred technique comprises placing the wafer 10 in an oxidizing atmosphere at an elevated temperature and adding $H_2O$ vapors to the oxidizing atmosphere so as to expedite the growth of layer 14. Layer 14 aids in maintaining the surface of wafer 10 free from ambient impurities and allows glass to be deposited thereover without affecting the surface of wafer 10.

Figure 3:
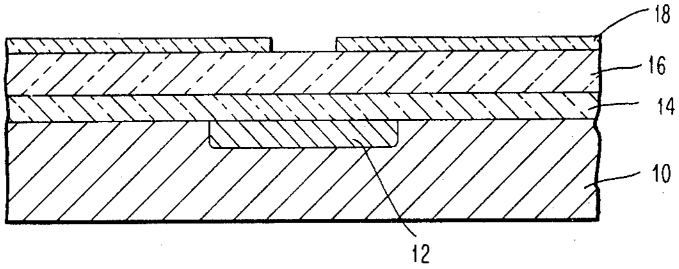

FIGURE 3 shows a glass layer 16 on the silicon dioxide layer 14. A suitable glass is Corning 7740 glass, which fires at 840° C. Conventional techniques (for example, the process taught in the U.S. Patent 3,247,428, filed Sept. 29, 1961, and assigned to the same assignee as this application) are suitable for forming this glass layer. For purposes of illustration, layer 16 may be 8,000 to 500,000 angstroms thick. The process taught in the referenced application comprises, in outline, placing a slurry of glass onto the upper surface of silicon dioxide layer 14, and drying the slurry so as to form a powdery layer of glass. The glass is then fired and layer 16 is thereby formed on silicon dioxide layer 14.

As mentioned in the referenced copending application, several advantages result from that process. This glass layer, combined with silicon dioxide layer 14, protects the surface of wafer 10 from contamination. Further, it has been found that employing the silicon dioxide layer 14 initially, permits the use of a glass whose thermal coefficient of linear expansion matches that of wafer 10. Resultant strains and cracks of wafer 10 are thereby minimized.

FIGURE 3 also shows the provision of a photoresist material layer 18 formed on selected portions of the glass layer 16. A photoresist material is one which upon exposure to light becomes resistant to the action of certain chemicals. Any photoresist material may be used, but a typical photoresist material is KMER, a product of Eastman Kodak Co. Another photoresist material is KPR, also a product of Eastman Kodak Co. For purposes of illustration, KMER will be referred to in this patent. It is used in a conventional manner.

It is placed on all upper surfaces. The application may be by dipping, spraying or flowing the material on. If the latter is used, the wafer 10 must be spun in a centrifuge until the photoresist is dry. Upon drying, a mask, comprising a transparent material with opaque areas thereon, is placed over the wafer 10. Ultraviolet light is passed through the transparent areas of the mask and exposes the photoresist thereunder. KMER developer is then applied to the photoresist material and washes the nonexposed photoresist away—leaving precisely dimensioned holes in layer 18.

Figure 4:
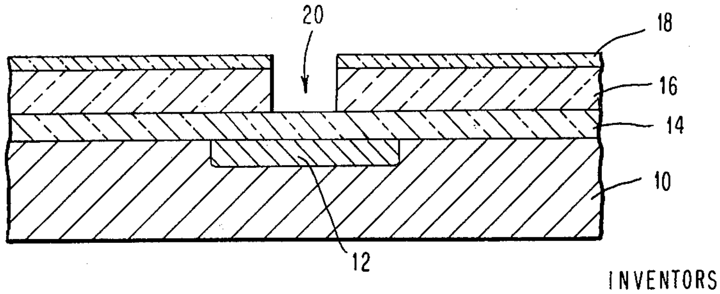

FIGURE 4 shows the device structure after it has been exposed to a single etchant. That etchant is one which will attack the glass, and not the silicon dioxide layer 14. Many of these are known in the prior art, but a typical one employed by us comprises hydrofluoric acid vapors in a nitrogen gas carrier. For purposes of illustration, a suitable arrangement would be to have approximately 3% of the total nitrogen gas flow bubble through hydrofluoric acid from a depth of about one inch. The remainder of the flow would be pure nitrogen. A typical flow rate would be six cubic feet per hour. The time of exposure increases with the thickness of glass to be etched away. FIGURE 4 shows a resultant hole 20, which has been etched through the glass layer 16, but not through silicon dioxide layer 14.

Figure 5:
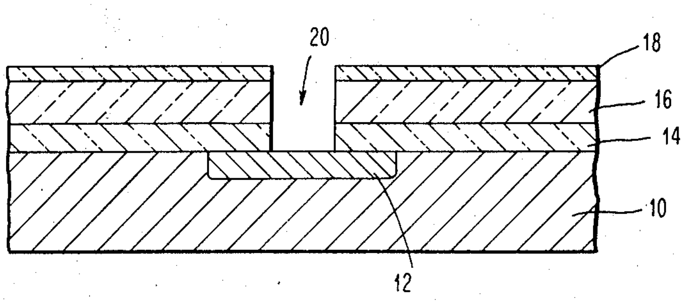

In order to deposit a contact metal, a portion of silicon dioxide layer 14 must be etched away so as to expose surface junction region 12. The exposed area of layer 14 is removed by submerging the device in an etchant which will attack it; the structure of FIGURE 5 is left. A common etchant for that purpose is an ammonium bifluoride buffered solution of hydrofluoric acid. A preferred mixture is made up by adding 340 grams of $NH_4F$ to 100 ml. of $H_2O$, and then adding one part of HF to ten parts of the preceding mixture. During the etching step, the remaining glass layer 16 serves to mask the surface of the silicon dioxide layer 14 so as to insure the removal of a precise amount of layer 14. The result is that hole 20 is extended to surface junction region 12—and the diametral dimension of hole 20 is the same at all levels, a distinct advantage of this invention. Now that surface junction region 12 is exposed, we provide a method of depositing a contact metal thereon.

Figure 6:
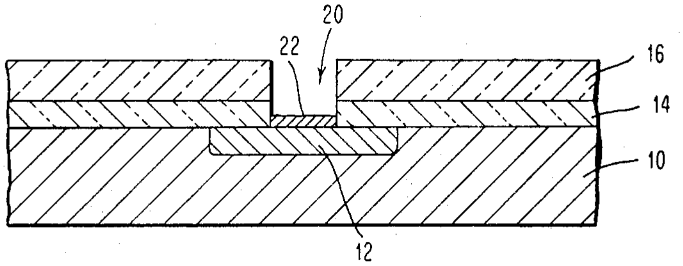

FIGURE 6 shows a contact metal 22 deposited onto surface junction region 12. The deposition process consists of coating the entire upper surface of the device, as well as photoresist material layer 18, with contact metal 22 and then selectively removing portions of metal 22. After coating the entire upper surface of the device with metal 22, the photoresist material layer 18 is attacked by a solvent, such as tricholroethylene ($C_2HCl_3$), which softens and loosens it. Photoresist material layer 18, and the contact metal 22 adherent thereto is then peeled away. A deposit of contact metal 22 is left on the surface junction region 12 as shown. There are many contact metals which may be employed, but for purposes of illustration aluminum is used in the preferred embodiment. An alternate contact metal is nickel. In order to alloy contact metal 22 to surface junction region 12, the entire device is placed in a nitrogen atmosphere and heated. A temperature of approximately 600° C. is necessary to alloy aluminum, while 800° C. is necessary for nickel.

Figure 7:
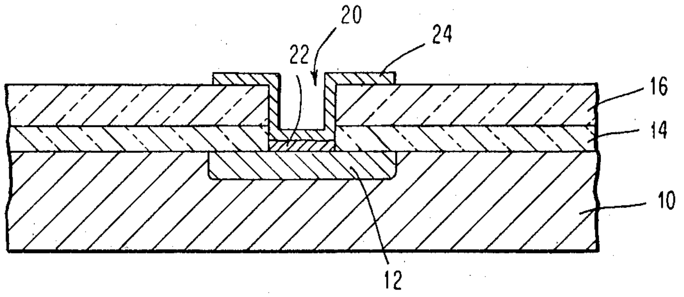

FIGURE 7 shows a layer of hermetic metal 24 formed on certain areas of the device. It provides an effective seal for the ohmic contact which has been formed by alloying metal 22 to surface junction region 12.

The actual deposition of metal 24 would be by conventional techniques. For example, a mask is positioned over the upper surface of the device. The mask has openings in it roughly twice the diameter of holes 20. Each opening is centered over an associated hole 20. The hermetic metal 24 is evaporated through said mask. Hermetic metal 24 coats contact metal 22, the walls of individual holes 20, and concentric areas of glass layer 16 so as to form a continuous seal thereover. A preferred metal is chromium, although titanium or molybdenum may be employed.

The basic process steps for forming an improved ohmic contact to surface regions of a semiconductor device have been demonstrated. The ohmic contact formed thereby is particularly characterized by having a coating thereon which is impervious to ambient impurities. Such a semiconductor device could now be made operative by establishing a source of current to the ohmic contact region. In prevalent applications, however, it is desirable to place a plurality of such semiconductor devices onto a large substrate having conductive paths on its surface. A preferred way of doing this is to solder the devices to the conductive paths on the substrate. In order to do this, the hermetic metal must be coated with a wettable metal layer 26 as shown in FIGURE 8.

Figure 8:
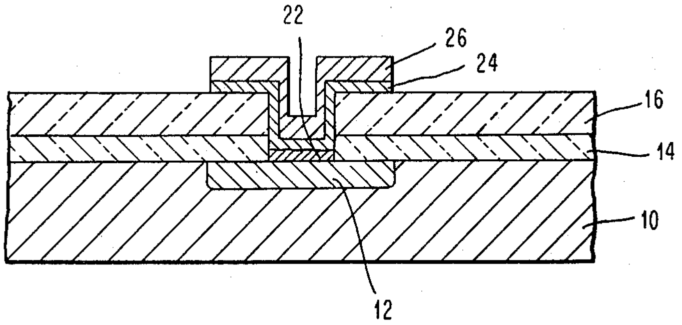
FIGURE 8 shows the device after a layer of wettable metal has been deposited on said contact.

The wettable metal 26 of FIGURE 8 is any metal which is solderable. One such metal is copper. The wettable metal layer 26 is deposited onto the hermetic metal layer 24 by conventional techniques—such as the aforementioned deposition through a mask.

Figure 9:
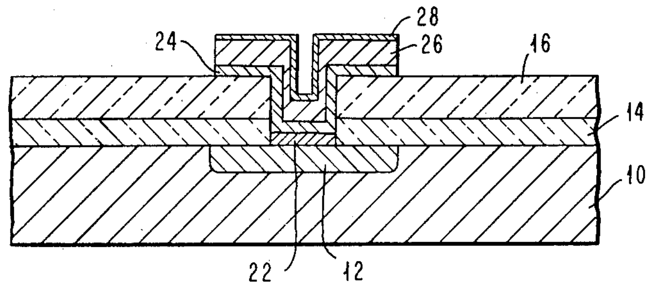
FIGURE 9 shows the device having a layer of nonoxidizable metal on the ohmic contact.

Due to the requirements of mass production, it is common today for devices to be manufactured and stored prior to actual employment. During this storage period, the device must be protected from external influences. In order to insure that the device operating characteristics, and the contact structure in particular, are not affected by oxidation, we deposit a layer of nonoxidizable metal on the upper surface of the contact structure. FIGURE 9 shows a device having a nonoxidizable metal layer 28 deposited on layer 26. Deposition per se is by standard techniques; evaporation through a mask being suitable. A suitable nonoxidizable metal is one of the rare metals; for example, gold is employed in the preferred embodiment.

Figure 10:
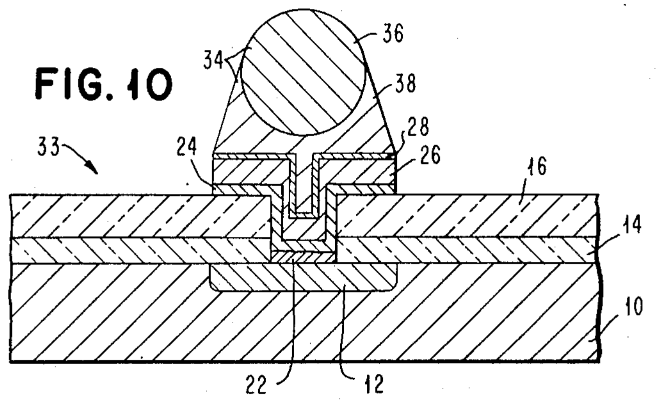
FIGURE 10 shows a novel material formation on the ohmic contact, allowing attachment of the device to a substrate bearing discrete conductive paths without shorting.
Figure 11:
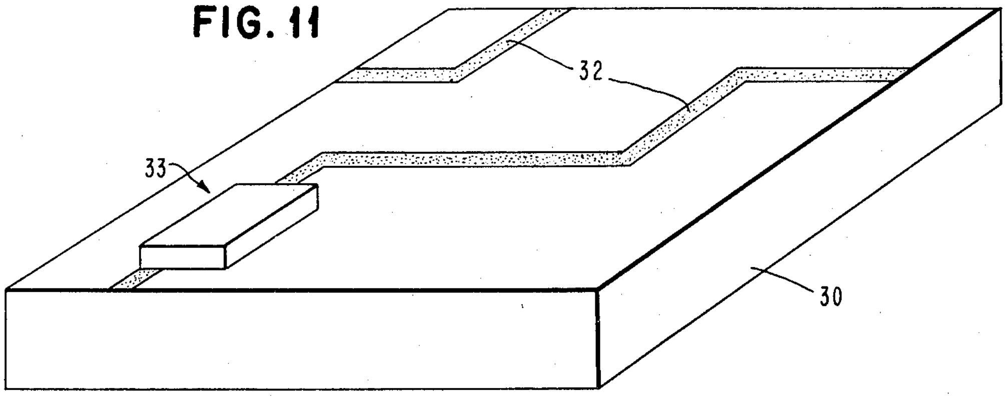
FIGURE 11 shows a device of FIGURE 10 positioned on a substrate.

As mentioned previously, a plurality of the novel devices having improved ohmic contacts are attached to a substrate having conductive paths. Such an arrangement is shown in FIGURE 11—substrate 30 having conductive paths 32 and a device 33 attached thereto. However, FIGURE 10 shows a preferred device structure 33. It insures a good connection to the conductive paths 32, obviates the problem of short circuits between other regions of device 33 and conductive paths 32, and relieves stresses which may build up as the connection is made.

FIGURE 10 shows, in exaggerated fashion, a protuberance 34 formed on the upper surface of nonoxidizable layer 28 so as to allow subsequent joining to substrate 30. Protuberance 34 comprises a metal 36, having excellent electrical conductivity characteristics (such as either copper or nickel, each plated with gold) and coated with a layer of solder 38. Similar protuberances are provided at each ohmic contact.

Thus, in order to position a device 33 onto the conductive path 32 of a substrate 30 as shown in FIGURE 11, the conductive path 32 should be tinned. Then, protuberance 34 is brought into contact with the tinned conductive surface 32 under heat and pressure. A connection between substrate 30 and device 33 is thereby established.

The unique shape of protuberance 34 maintains the device at a significant distance from the substrate 30. Thus, electrical conductivity is only established between ohmic contacts and substrate 30—and not between any other regions. The undesired contacting of prior art devices, and attendant disadvantages from shorting, are thereby prevented by protuberance 34. Stresses of joining are also relieved.

While the invention has been particularly shown and described with reference to preferred embodiments thereof, it will be understood by those skilled in the art that various changes in form and details may be made therein without departing from the spirit and scope of the invention.

What is claimed is:

1. A semiconductor device comprising:
a body of semiconductive material having upper and lower surfaces;
a plurality of surface regions on said upper surface, at least one of said surface regions being a contact region;
a protective layer consisting of an oxide of said semiconductive material on said surface regions other than said contact region;
a glass layer on said protective oxide layer;
a contact metal alloyed to said contact region;
and a hermetic metal seal coating said contact metal and a portion of said glass layer surrounding the contact metal so as to prevent ambient impurities from reaching said contact region.

2. A semiconductor device of the type described in claim 1 and having a wettable metal layer formed on said hermetic metal seal so as to enable said device to be soldered to another body.

3. A semiconductor device of the type described in claim 2 and having a layer of nonoxidizable metal formed on said wettable metal layer so as to retard any oxidation of said wettable metal.

4. A semiconductor device of the type described in claim 3 and having a protuberance, comprising solder and an electrically conductive metal, formed on said nonoxidizable metal layer so as to facilitate soldering said device to another body.

5. A semiconductor device comprising:
a body of semiconductive material having upper and lower surfaces;
a plurality of surface regions on said upper surface, at least one of said surface regions being a contact region;
a vitreous protective layer on said surface regions other than said contact region;
a glass layer on said protective layer;
an ohmic contact metal layer in contact with said contact region;
a layer of hermetic sealing metal in hermetic sealing relationship on at least a portion of said ohmic contact metal layer to prevent ambient impurities from attacking said portion of said contact and to complete an ohmic contact with said contact metal; and
a protuberance over said hermetic sealing metal, protuberance being composed of an electrically conductive metal.

6. The semiconductor device of claim 5 wherein a layer of metal is located between said hermetic sealing metal layer and said protuberance to improve the bondability of the said hermetic layer to said protuberance.

7. A semiconductor device comprising:
a body of semiconductive material having upper and lower surfaces;

a plurality of surface regions on said upper surface, at least one of said regions being a contact region;
a protective layer on said surface regions other than said contact region;
a glass layer on said protective layer;
a metal layer ohmic contact in contact with said contact region;
a layer of hermetic sealing metal in hermetic sealing relationship on at least a portion of said ohmic contact metal layer to prevent ambient impurities from attacking said portion of said contact and to complete an ohmic contact with said contact metal;
a layer of wettable metal over said layer of hermetic sealing metal;
a layer of non-oxidizable metal over said wettable metal layer; and
a protuberance over said metal, said protuberance being composed of an electrically conductive metal and solder.

8. The semiconductor device of claim 7 wherein said non-oxidizable hermetic sealing is chromium.

9. The semiconductor device of claim 7 wherein said hermetic sealing metal is titanium.

10. The semiconductor device of claim 7 wherein said hermetic sealing metal is molybdenum.

11. A semiconductor device comprising:
a body of semiconductive material having upper and lower surface;

a plurality of surface regions on said upper surface, at least one of said regions being a contact region;
a protective layer consisting of an oxide of said semiconductive material on said surface regions other than said contact region;
a glass layer on said protective layer;
an aluminum ohmic contact layer in contact with said contact region;
a layer of chromium over at least a portion of said aluminum layer to prevent ambient impurities from attacking said ohmic contact;
a layer of copper over said chromium layer;
a layer of gold over said copper layer; and
a protuberance over at least a portion of said gold layer, said protuberance being composed of an electrically conductive metal and solder.

References Cited

UNITED STATES PATENTS

| | | | |
|---|---|---|---|
| 3,114,867 | 12/1963 | Szekely. | |
| 3,247,428 | 4/1966 | Perri et al. | 317—235 |

ROBERT S. MACON, Primary Examiner
D. SMITH, Jr., Assistant Examiner

U.S. Cl. X.R.

29—630; 117—212